United States Patent
Wityak et al.

(10) Patent No.: US 9,391,241 B2
(45) Date of Patent: Jul. 12, 2016

(54) LIGHT EMITTING DIODE

(71) Applicant: Materion Corporation, Mayfield Heights, OH (US)

(72) Inventors: George M. Wityak, Albuquerque, NM (US); Alan Duckham, Orchard Park, NY (US)

(73) Assignee: Materion Corporation, Mayfield Heights, OH (US)

(*) Notice: Subject to any disclaimer, the term of this patent is extended or adjusted under 35 U.S.C. 154(b) by 0 days.

(21) Appl. No.: 14/205,447

(22) Filed: Mar. 12, 2014

(65) Prior Publication Data

US 2014/0264394 A1  Sep. 18, 2014

Related U.S. Application Data

(60) Provisional application No. 61/793,301, filed on Mar. 15, 2013.

(51) Int. Cl.
*H01L 33/46* (2010.01)
*H01L 25/075* (2006.01)
*C22C 5/06* (2006.01)
*H01L 33/00* (2010.01)

(52) U.S. Cl.
CPC . *H01L 33/46* (2013.01); *C22C 5/06* (2013.01); *H01L 25/0753* (2013.01); *H01L 33/0095* (2013.01); *H01L 2924/0002* (2013.01); *H01L 2933/0025* (2013.01)

(58) Field of Classification Search
CPC .......... G11B 7/258; G11B 7/259; C22C 5/06; C22C 5/08
See application file for complete search history.

(56) References Cited

U.S. PATENT DOCUMENTS

| | | | |
|---|---|---|---|
| 2004/0028912 A1* | 2/2004 | Tauchi et al. | 428/434 |
| 2004/0263984 A1 | 12/2004 | Nakai et al. | |
| 2006/0006400 A1* | 1/2006 | Yoo | 257/94 |
| 2006/0093510 A1* | 5/2006 | Obata | C22C 5/06 420/501 |
| 2007/0020426 A1* | 1/2007 | Nakai et al. | 428/64.4 |
| 2012/0100648 A1 | 4/2012 | Huang et al. | |
| 2013/0015480 A1 | 1/2013 | Sugawara et al. | |

FOREIGN PATENT DOCUMENTS

JP  2005-146419  9/2005

OTHER PUBLICATIONS

International Search Report for corresponding PCT Application No. PCT/US2014/023886 dated Jul. 10, 2014.

* cited by examiner

*Primary Examiner* — Khaja Ahmad
(74) *Attorney, Agent, or Firm* — Richard M. Klein; Fay Sharpe LLP

(57) ABSTRACT

A light emitting diode with a front surface adapted to emit light and a rear surface is provided with a reflective coating on the rear surface, the reflective coating being primarily silver and containing either 0.4% bismuth or a combination of 0.5% tin, 0.2% copper, and 0.2% samarium.

15 Claims, 2 Drawing Sheets

LIGHT EMITTING DIODE

CROSS REFERENCE TO RELATED PATENTS AND APPLICATIONS

This application claims priority to and the benefit of the filing date of U.S. Provisional Patent Application Ser. No. 61/793,301, filed Mar. 15, 2013, which application is hereby incorporated by reference.

BACKGROUND

The present disclosure relates to light emitting diodes and more particularly to reflective coatings for light emitting diodes and light emitting diodes with reflective coatings.

Light emitting diodes are used in many applications including indicator lights, as backlighting for liquid crystal display panels for television sets, monitors, and other displays, automotive lighting and other lighting. LEDs are also becoming much more popular as general illumination devices. The demand for LEDs is growing. The demands on LEDs are growing. LEDs are expected to operate reliably for long periods of time. LEDs are expected to maintain consistent light output over extended periods of time. In many applications LEDs are expected to maintain light output over years or decades.

LEDs are often used in structures or situations in which there is a preferred direction of light emission. Thus, if a light emitting diode is mounted on a structure behind a liquid display, the preferred direction of light emission is toward the liquid crystal array. If a light emitting diode is on a control panel, the direction of preferred lighting is toward the person viewing the panel. Light emitting diodes often have reflective coatings on the surface away from the direction of preferred light emission. In the past, some of these coatings have been pure silver. Pure silver is prone to environmental degradation which can adversely affect the reflective and adhesive properties of the coating.

SUMMARY OF THE DISCLOSURE

A light emitting diode is provided having a light emitting front surface and a rear surface, a reflective layer on the rear surface of the light emitting diode is selected from a silver bismuth composition having about 0.4% bismuth and the balance silver and, a silver, tin, copper, samarium composition having about 0.5% tin, 0.2% copper, 0.2% samarium and the balance silver.

Further in accordance with the disclosure, a light emitting diode having a light emitting front surface and a rear surface is provided with a reflective coating on the rear surface having improved corrosion resistance characteristics and improved adhesion characteristics.

Still further in accordance with the disclosure, a light emitting diode having a light emitting front surface and a rear surface is provided with a reflective coating on the rear surface which adheres tenaciously to the light emitting diode preventing sideways infiltration of the margins of the reflective coating.

It is an object of the present disclosure to provide a light emitting diode which will maintain high light emission for long periods of time.

It is another object of the present disclosure to provide a light emitting diode with a reflective coating which will maintain high reflectivity, resist tarnish and corrosion, resist infiltration and survive numerous thermal cycles.

It is yet another object of the present disclosure to provide a silver alloy or group of silver alloys for application as reflective coatings to light emitting diodes which will improve the long term operation of the light emitting diode, prevent degradation of light output due to tarnishing or corrosion of the light emitting diode and extend the life of light emitting diodes.

In accordance with another aspect, a method of creating an improved light emitting diode comprising the steps of providing a light emitting diode having a front surface adapted to emit light and a rear surface, and coating the rear surface of the light emitting diode with a reflective coating selected from the class of: a silver bismuth composition having about 0.4% bismuth and the balance silver; and, a silver tin copper samarium composition having about 0.5% tin, 0.2% copper, and 0.2% samarium and the balance silver.

The coating can be applied to the light emitting diode by sputtering. The coating can be applied to the light emitting diode while the light emitting diode is part of a wafer of several light emitting diodes. The method can also include separating the light emitting diode from the wafer.

In accordance with still another aspect, a wafer comprises a front surface, a back surface, and a plurality of dies formed thereon including light emitting diodes, wherein the back surface is coated with a reflective layer, the reflective layer comprising a composition selected from the class of: a silver bismuth composition having about 0.4% bismuth and the balance silver; and, a silver tin copper samarium composition having about 0.5% tin, 0.2% copper, and 0.2% samarium and the balance silver.

The wafer can further include a sapphire substrate, and the reflective layer can be on the sapphire substrate. The reflective layer can have improved resistance to environmental degradation as compared to pure silver, and thereby have improved adhesion characteristics, improved anti-corrosion characteristics, and improved stability. The reflective layer can be a sputtered reflective layer.

These and other objects of the present disclosure will become evident from the following detailed description taken in conjunction with the accompanying drawings which form a part hereof.

DETAILED DESCRIPTION OF THE DISCLOSURE

Figure 1:
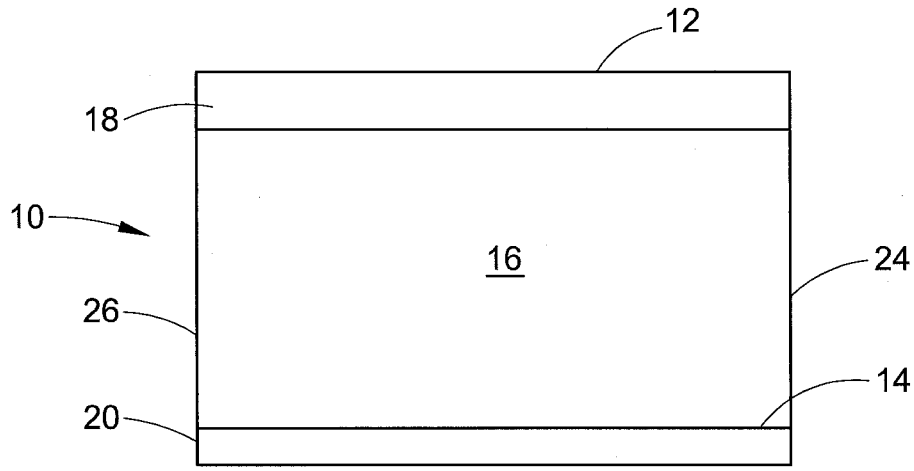
FIG. 1 shows schematically a light emitting diode with a coating in accordance with the present disclosure.

Referring now to the drawings wherein the showings are made for the purposes of illustrating a preferred embodiment of the disclosure only and not for the purpose of limiting same, FIG. 1 shows a light emitting diode 10 in accordance with the present disclosure. The light emitting diode 10 has a light emitting front surface 12 and a rear surface 14. The light emitting diode 10 illustrated has a substrate portion 16 and a junction portion 18 on top of the substrate portion 16. In some light emitting diodes, the substrate portion 16 is sapphire and junction portions are created on top of the substrate portion. In other light emitting diodes, different substrates are used. Moreover, light emitting diodes are made with different junction materials and junction structures. The present disclosure contemplates improving any of these varied light emitting diode structures.

A coating 20 is directly adjacent and in firm adhering contact with the rear surface of the light emitting diode 14. The coating 20 can be either of two coating materials, one containing about 0.4% bismuth and the remainder of the composition being silver and the second containing about 0.5% tin, 0.2% copper, 0.2% samarium and the balance being silver. Either of these coatings is applied to the rear surface 14 of the light emitting diode. The coating 20 is high reflectivity. This coating 20 reflects light emitted from the junction portion 18 of the light emitting diode 10 back toward the junction portion so that it may be emitted from the front surface 12 of the light emitting diode in the preferred light emission direction. Light emitting diodes often have a preferred direction of emission. Light emitted in this direction performs the function for which it is intended. Light emitted in other directions is wasted.

Light emitting diodes are currently used in devices expected to last for several years and often several decades. The coating of the present disclosure maintains high reflectivity for an extended period of time. The coatings of the present disclosure resist corrosion. The coatings of the present disclosure resist infiltration of contaminants from the sides, 24, 26 of the light emitting diode which can interfere with reflectivity. The coatings of the present disclosure resist tarnish which can be a problem with silver coatings over time.

The coatings of the present disclosure also maintain coating to light emitting diode integrity over very large numbers of thermal cycles. Thermal cycles occur when a light emitting diode is turned on and off repeatedly stressing the physical structure.

The coatings of the present disclosure are best applied to the light emitting diode in the light emitting diode manufacturing process. Light emitting diodes are often manufactured as part of a wafer fabrication process in which wafers of a substrate or material are processed in a manner similar to the processing of integrated circuit products. Electronic features and components are created on the front surface of the wafer with conventional techniques. While this wafer is still intact, the rear surface 14 of each individual diode is exposed as the rear surface of the wafer and can be coated with the coating 20.

Figure 2:
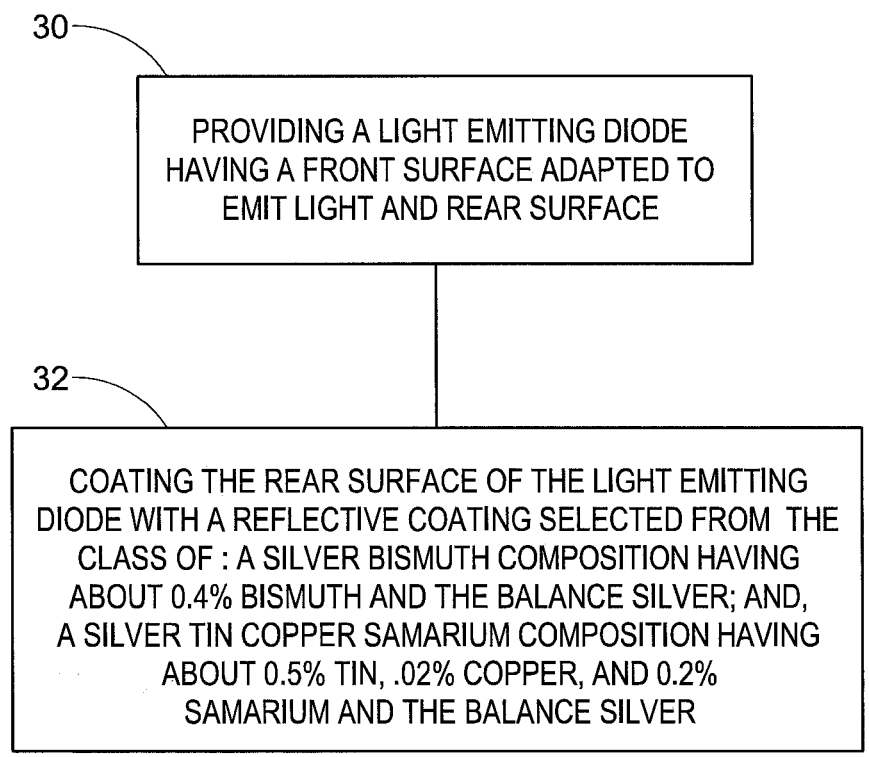
FIG. 2 is a flow chart illustrating a process of applying the coating of the current disclosure.

With reference to FIG. 2, the process of coating the rear surface of a diode is illustrated. In process step one, 30, a light emitting diode, actually several or many light emitting diodes, are provided with front surfaces capable of emitting light by creation of a junction area and a rear surface. In process two, 32, the rear surface of the light emitting diodes, in the wafer state, are coated with either a composition having about 0.4% bismuth and the balance silver or a coating having about 0.5% tin, 0.2% copper, 2% samarium and the balance silver. Thereafter, the wafer can be further processed and cut into dies for making the individual light emitting diode illustrated in FIG. 1. The coating 20 is applied by sputtering or other conventional technique.

This specific percentage of bismuth, 0.4% in the first composition is believed to be optimum. However, the percentage of bismuth can be varied somewhat. Likewise, the amount of tin, copper, and samarium in the second composition can vary from the proportions stated by small amounts without significantly interfering with the positive properties of the coatings described.

Figure 3:
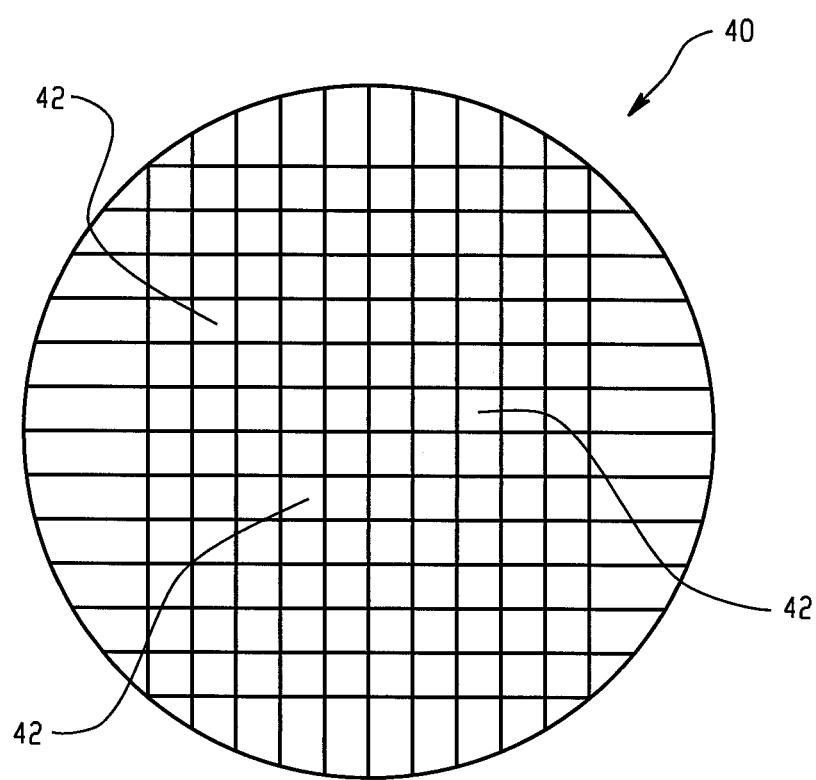
FIG. 3 is a plan view of an exemplary wafer in accordance with the present disclosure.

Turning to FIG. 3, an exemplary wafer 40 includes a plurality of dies 42 including light emitting diodes (e.g., each square on the wafer 40 is an individual die). The surface of the wafer visible in FIG. 3 corresponds to the rear surface of the light emitting diodes when the dies 42 are separated from the wafer 40. Accordingly, this surface of the wafer is coated with either a composition having about 0.4% bismuth and the balance silver or a coating having about 0.5% tin, 0.2% copper, 2% samarium and the balance silver. Thereafter, the wafer 40 can be further processed and cut into dies for making the individual light emitting diode illustrated in FIG. 1. The coating 20 is applied by sputtering or other conventional technique.

Having thus described the disclosure, it is claimed:

1. A light emitting diode comprising a front surface adapted to emit light and a rear surface; a reflective layer on the rear surface of the light emitting diode adapted to reflect light toward the light emitting diode front surface, the reflective layer comprising:
    a silver tin copper samarium composition having 0.5% tin, 0.2% copper, and 0.2% samarium and the balance silver.

2. The light emitting diode of claim 1 wherein the light emitting diode is on a sapphire substrate and the reflective layer is on the sapphire substrate.

3. The light emitting diode of claim 1 wherein the reflective layer has improved resistance to environmental degradation as compared to a reflective layer of pure silver, and thereby has improved adhesion characteristics, improved anti-corrosion characteristics, and improved stability.

4. The light emitting diode of claim 3 having an extended life time at rated light output as compared to a light emitting diode having a reflective layer of pure silver.

5. The light emitting diode of claim 1, wherein the reflective layer is a sputtered reflective layer.

6. A silver alloy for application as a reflective coating to a light emitting diode, the alloy comprising 0.5% tin, 0.2% copper, and 0.2% samarium and the balance silver.

7. A method of creating an improved light emitting diode comprising the steps of:
    providing a light emitting diode having a front surface adapted to emit light and a rear surface; and
    coating the rear surface of the light emitting diode with a reflective coating comprising:
        a silver tin copper samarium composition having 0.5% tin, 0.2% copper, and 0.2% samarium and the balance silver.

8. The method of claim 7 wherein the coating is applied to the light emitting diode by sputtering.

9. The method of claim 7 wherein the coating is applied to the light emitting diode while the light emitting diode is part of a wafer of several light emitting diodes.

10. The method of claim 9, wherein the coating is applied to the light emitting diode by sputtering.

11. The method of claim 10, further comprising separating the light emitting diode from the wafer.

12. A wafer comprising a front surface, a back surface, and a plurality of dies formed thereon including light emitting diodes, wherein the back surface is coated with a reflective layer, the reflective layer comprising:
    a silver tin copper samarium composition having 0.5% tin, 0.2% copper, and 0.2% samarium and the balance silver.

13. The wafer of claim 12, further comprising a sapphire substrate, wherein the reflective layer is on the sapphire substrate.

14. The wafer of claim 13, wherein the reflective layer has improved resistance to environmental degradation as compared to a reflective layer of pure silver, and thereby has improved adhesion characteristics, improved anti-corrosion characteristics, and improved stability.

15. The wafer of claim 12, wherein the reflective layer is a sputtered reflective layer.

\* \* \* \* \*